United States Patent
Liu et al.

(10) Patent No.: US 10,277,230 B2
(45) Date of Patent: Apr. 30, 2019

(54) JITTER REDUCTION IN CLOCK AND DATA RECOVERY CIRCUITS

(71) Applicant: Apple Inc., Cupertino, CA (US)

(72) Inventors: Wenbo Liu, Cupertino, CA (US); Ming-Shuan Chen, Santa Clara, CA (US); Sanjeev K. Maheshwari, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/714,719

(22) Filed: Sep. 25, 2017

(65) Prior Publication Data

US 2019/0097638 A1    Mar. 28, 2019

(51) Int. Cl.
*H03L 7/089* (2006.01)
*H03L 7/08* (2006.01)
*H03L 7/099* (2006.01)
*H04L 7/027* (2006.01)

(52) U.S. Cl.
CPC .......... *H03L 7/0807* (2013.01); *H03L 7/0891* (2013.01); *H03L 7/099* (2013.01); *H04L 7/027* (2013.01)

(58) Field of Classification Search
CPC ... H03L 7/0807; H03L 7/0891; H03L 7/0893; H03L 7/0895; H03L 7/0896; H03L 7/0898; H03L 7/099; H03L 7/0991; H03L 7/0992; H03L 7/0993; H03L 7/0994; H03L 7/0995; H03L 7/0996; H03L 7/0997; H03L 7/0998
USPC ........................................................ 327/148
See application file for complete search history.

(56) References Cited

U.S. PATENT DOCUMENTS

| | | | |
|---|---|---|---|
| 7,369,068 B2 | 5/2008 | Goller et al. | |
| 8,019,022 B2 | 9/2011 | Liu et al. | |
| 8,067,965 B2 | 11/2011 | Wei et al. | |
| 8,283,957 B2 | 10/2012 | Sai | |
| 8,284,887 B2 | 10/2012 | Kikuchi et al. | |
| 8,457,269 B2 | 6/2013 | Chang et al. | |
| 8,810,292 B2 * | 8/2014 | Katsushima | H03L 7/06 327/148 |
| 9,680,483 B2 | 6/2017 | Tsunoda | |
| 2007/0002993 A1 | 1/2007 | Wang et al. | |
| 2008/0111597 A1 | 5/2008 | Cranford et al. | |

(Continued)

OTHER PUBLICATIONS

Beginners Guide to Clock Data Recovery—PDA, by addy7de, Feb. 1, 2017, 18 pages.

(Continued)

*Primary Examiner* — Patrick C Chen
(74) *Attorney, Agent, or Firm* — Meyertons, Hood, Kivlin, Kowert & Goetzel, P.C.

(57) ABSTRACT

Techniques are disclosed relating to clock and data recovery circuitry. In some embodiments, a slicing circuit may be configured to sample an input signal to generate a first and second sampled data signal. In some embodiments, a phase detector circuit may be configured to compare the phases of the first and second sampled data signals. In some embodiments, a first charge pump may be configured to supply a first current to a circuit node, and a second charge pump may be configured to supply a second current to the circuit node. In some embodiments, a voltage-controlled oscillator may be configured to adjust a frequency of first and second clock signals based on a voltage of the circuit node.

20 Claims, 10 Drawing Sheets

(56) References Cited

U.S. PATENT DOCUMENTS

2012/0063546 A1\* 3/2012 Kobayashi ............. H03L 7/087
 375/316
2015/0372682 A1\* 12/2015 Alexeyev ................ H03L 7/085
 327/156

OTHER PUBLICATIONS

Azita Emami, Lecture 17: Clock Recovery, Slides from Prof. M. Horowitz, Computer Systems Laboratory, Stanford University, 2001, 18 pages.
Sam Palermo, ECEN720: High-Speed Links Circuits and Systems, Spring 2017, Lecture 12: CDRs, Analog & Mixed-Signal Center, Texas A&M University, 43 pages.

\* cited by examiner

JITTER REDUCTION IN CLOCK AND DATA RECOVERY CIRCUITS

BACKGROUND

Technical Field

This disclosure relates generally to clock and data recovery circuitry, and more particularly to jitter reduction techniques in clock and data recovery circuitry.

Description of the Related Art

In serial data communication, data may be transmitted (e.g., between circuit blocks) without an accompanying clock signal. To properly sample the serial data, a receiver circuit may use a recovered clock operating at the same frequency as a clock at the transmitter circuit. In various embodiments, a receiver circuit may include a clock and data recovery ("CDR") circuit configured to generate a recovered clock based on the serial data and use that recovered clock to sample the serial data.

Various CDR circuits utilize a voltage-controlled oscillator ("VCO") to generate a recovered clock at the receiver circuit. For example, a VCO may be configured to adjust a frequency of a recovered clock based on a voltage of a circuit node. The recovered clock generated by the VCO-based CDR circuit may, in some instances, include "jitter," or deviations in periodicity between or within cycles of the recovered clock. In various cases, it may be desirable to mitigate jitter in the recovered clock of a CDR circuit.

SUMMARY

Techniques are disclosed relating to clock and data recovery circuitry. In some embodiments, an apparatus includes a slicing circuit configured to sample an input signal based on first and second clock signals to generate a first and second sampled data signal. In some embodiments, the apparatus further includes a phase detector circuit configured to perform a comparison of a phase of the first sampled data signal and the second sampled data signal, and to generate first and second control signals based on a result of the comparison. The apparatus further includes, according to some embodiments, a control circuit configured to generate third and fourth control signals using the first and second control signals. Further, in some embodiments, the apparatus includes a first charge pump circuit and a second charge pump circuit. In various embodiments, the first charge pump circuit may be configured to supply a first current to a circuit node based on the first and second control signals, and the second charge pump circuit may be configured to supply a second current to a circuit node based on the third and fourth control signals. In some embodiments, the second current may be of opposite polarity to the first current. Further, in some embodiments, the apparatus may include a voltage-controlled oscillator configured to adjust a frequency of the first and second clock signals based on a voltage of the circuit node.

In some embodiments, the first charge pump circuit may be configured to supply the first current at a first time, and the control circuit and second charge pump circuit may be configured to supply the second current at a second time subsequent to the first time.

Figure 1:
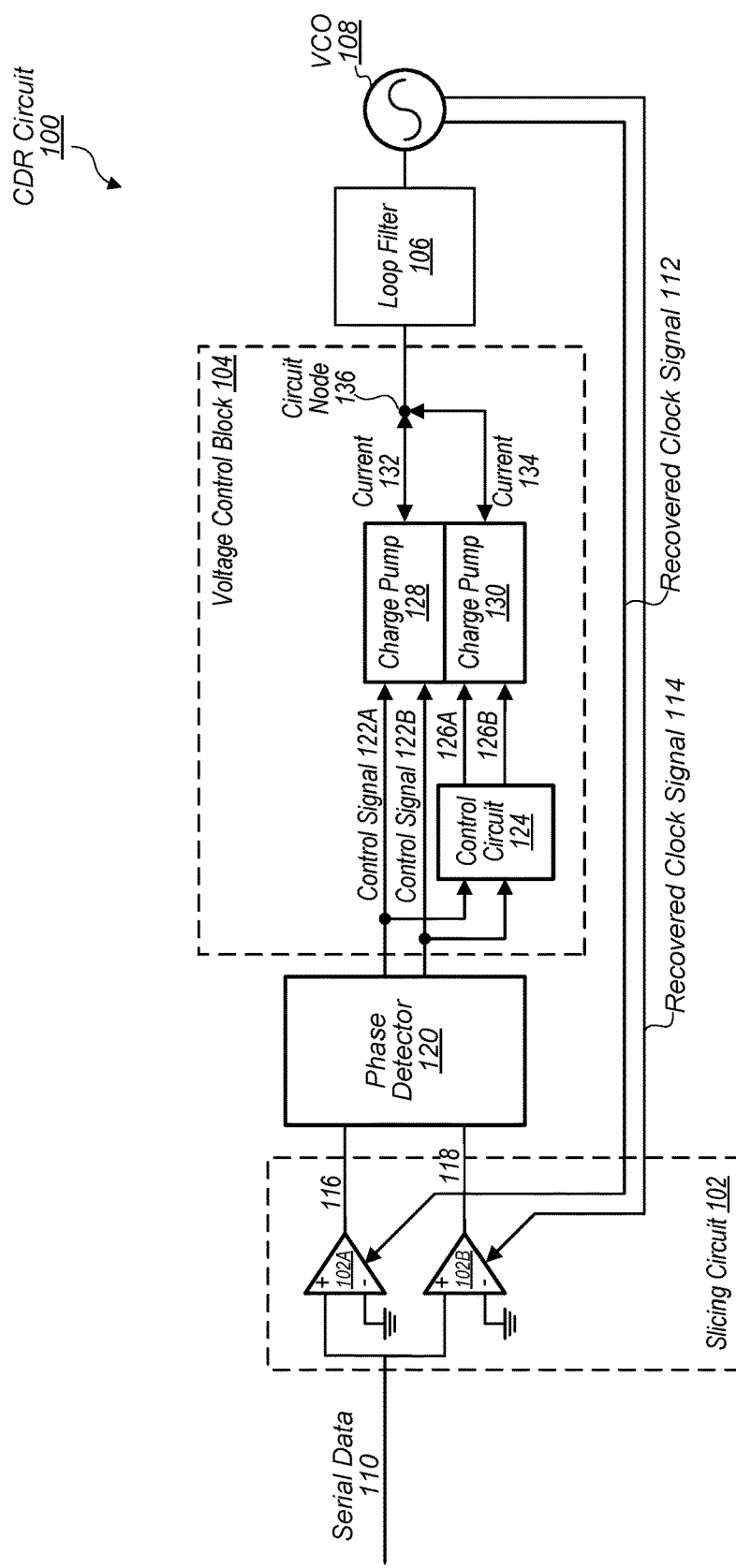
FIG. 1 is a block diagram illustrating an example CDR circuit, according to some embodiments.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Although specific embodiments are described below, these embodiments are not intended to limit the scope of the present disclosure, even where only a single embodiment is described with respect to a particular feature. Examples of features provided in the disclosure are intended to be illustrative rather than restrictive unless stated otherwise. The description herein is intended to cover such alternatives, modifications, and equivalents as would be apparent to a person skilled in the art having the benefit of this disclosure.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. Rather, this application is intended to cover all modifications, equivalents, and alternatives falling within the spirit and scope of the disclosure of the present application as defined by the appended claims. The headings used herein are for organizational purposes only and are not meant to be used to limit the scope of the description.

It is to be understood that the present disclosure is not limited to particular devices or methods, which may, of course, vary. It is also to be understood that the terminology used herein is for the purpose of describing particular embodiments only, and is not intended to be limiting. As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "charge pump configured to supply a current" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible. The term "configured to" is not intended to mean "configurable to." An unprogrammed FPGA, for example, would not be considered to be "configured to" perform some specific function, although it may be "configurable to" perform that function after programming.

DETAILED DESCRIPTION

Referring now to FIG. 1, a block diagram illustrating an example CDR circuit 100 is depicted, according to some embodiments. In various embodiments, CDR circuit 100 may be included as part of a larger circuit block that is configured to communicate with other circuit blocks, for example via serial communication over a communication link. For example, in one embodiment, CDR circuit 100 may be included as part of a memory system, which may be configured to communicate with one or more processor units. In the illustrated embodiment, CDR circuit 100 includes various elements, including slicing circuit 102, phase detector 120, voltage control block 104, loop filter 106, and VCO 108.

In various embodiments, CDR circuit 100 may be configured to receive serial data 110, generate one or more recovered clock signals (such as recovered clock signals 112 and 114) based on the serial data 110, and sample the serial data 110 using the one or more recovered clock signals to generate a recovered data signal. As used herein, "recovered clock signal" refers to a clock signal generated by CDR circuit 100 based on a frequency of the received serial data 110. Serial data 110 may, in various embodiments, be an input signal received by CDR circuit 100 from another circuit block, where the input signal is a data stream including a plurality of data symbols. Note that, in some embodiments, serial data 110 may be directly received by CDR circuit 100, for example from another circuit block of a computing system. In other embodiments, however, serial data 110 may be preconditioned by continuous-time linear equalizers, variable gain amplifiers, etc. before being received by CDR circuit 100.

As shown in FIG. 1, CDR circuit 100 includes slicing circuit 102. In various embodiments, slicing circuit 102 may be configured to receive, sample, and amplify serial data 110 to generate sampled data signals 116 and 118. In one embodiment, for example, slicing circuit 102 may include differential amplifiers 102A and 102B and one or more field effect transistors ("FETs") (not shown for clarity) configured to sample serial data 110 based on recovered clock signals 112 and 114, respectively, to generate sampled data signals 116 and 118. Note, however, that the described slicing circuit 102 is provided merely as an example and is not intended to limit the scope of this disclosure. One of ordinary skill in the art with the benefit of this disclosure will recognize that any slicing circuit suitable to sample serial data based on recovered clock signals may be implemented without departing from the scope of the present disclosure.

CDR circuit 100 further includes phase detector 120. In various embodiments, phase detector 120 may be configured to compare the phases of sampled data signals 116 and 118. For example, in some embodiments, phase detector 120 may be configured to receive sampled data signals 116 and 118 from slicing circuit 102, perform a comparison of the phase of sampled data signal 116 to the phase of sampled data signal 118, and generate control signals 122A and 122B based on a result of the comparison. Note that, in various embodiments, phase detector 120 may be any suitable linear or non-linear phase detector configured to compare the phase of two or more input data signals and generate control signals indicative of a difference in phase between the two data signals. For example, in various embodiments, phase detector 120 may be a full/half rate linear phase detector, a "bang-bang" phase detector, etc.

CDR circuit 100 further includes VCO 108. As discussed in more detail below, VCO 108 may be configured to adjust a frequency of the recovered clock signals 112 and 114 based on a voltage of a circuit node 136. For example, in various embodiments, an increase to the voltage of circuit node 136 may cause an increase to the output voltage of the loop filter 106, which, in turn, may cause VCO 108 to increase the frequency of recovered clock signals 112 and 114. Similarly, a decrease in the voltage of circuit node 136 may cause a decrease to the output voltage of the loop filter 106, which may cause VCO 108 to decrease the frequency of recovered clock signals 112 and 114. In this way, CDR circuit 100 may be configured to modify the frequency of recovered clock signals 112 and 114 in order to properly sample serial data 110. In various embodiments, recovered clock signals 112 and 114 may differ in phase. For example, in some embodiments, recovered clock signal 112 may be a delayed version of recovered clock signal 114, such that both recovered clock signals 112 and 114 operate at the same frequency, but differ in phase. For example, in one embodiment, recovered clock signal 112 may be $\pi/2$ radians out of phase relative to recovered clock signal 114.

Note that, although the operation of VCO 108 has been described in a particular manner (e.g., as being configured to increase a frequency of a signal based on an increase in a voltage at a circuit node), this description is provided merely as an example and is not intended to limit the scope of this disclosure. One of ordinary skill in the art with the benefit of this disclosure will recognize that other implementations of VCO 108 are possible and contemplated within the scope of this disclosure (e.g., a VCO in which a decrease in the voltage of a circuit node results in an increase in frequency of a signal generated by the VCO, etc.).

In the depicted embodiment, CDR circuit 100 includes voltage control block 104. As discussed in more detail below, voltage control block 104 may be configured to modify the voltage of circuit node 136 based on control signals 122A and 122B from phase detector 120.

For example, voltage control block 104 includes charge pumps 128 and 130. In various embodiments, charge pump 128 may be configured to supply a current 132 to circuit node 136 using control signals 122A and 122B. Further, voltage control block 104 includes control circuit 124. As discussed in more detail below with reference to FIGS. 3 and 4, control circuit 124 may be configured to generate control signals 126A and 126B based on control signals 122A and 122B, according to various embodiments. Control signals 126A and 126B may, in turn, be used by charge pump 130 to supply current 134 to circuit node 136. Current 134 may include various components. For example, in various embodiments, current 134 may include a component in which the polarity of current 134 is opposite of the polarity of current 132. In some embodiments (such as the embodiment depicted in FIG. 3, for example), if charge pump 128 supplies a positive current 132 (that is, sources current 132) to circuit node 136, then charge pump 130 would supply a current 134 with a negative component to (that is, sink a component of current 134 from) circuit node 136. Similarly, if charge pump 128 supplies a negative current 132 to circuit node 136, charge pump 130 would supply a current 134 with a positive component to circuit node 136. Note, however, that in some embodiments, charge pump 130 may be configured to supply a current 134 with both a positive and negative component, as described in more detail below with reference to FIG. 4 and FIG. 5B.

As discussed with reference to FIGS. 5A and 5B, the component of current 134 that is of opposite polarity to current 132 may be delayed relative to current 132. Stated differently, charge pump 128 may be configured to supply current 132 to circuit node 136 at a first time, while control circuit 124 and charge pump 130 may be configured to supply the opposite-polarity component of current 134 to circuit node 136 at a second, later time. Therefore, in various embodiments, the opposite-polarity portion of current 134 may be delayed by a particular duration relative to current 132. In one embodiment, for example, the particular duration of delay may be described as follows:

$$t_d = 1\text{-UI} \quad (1)$$

Where $t_d$ is the delay time and UI is the unit interval of serial data 110. As used herein, the term "unit interval" is to be understood according to its ordinary meaning in the art, which includes a symbol duration time for a symbol of the plurality of symbols included in serial data 110.

CDR circuit 100 further includes loop filter 106. In various embodiments, loop filter 106 may be configured to attenuate at least one frequency component included in the signal voltage of circuit node 136. For example, in some embodiments, loop filter 106 may be a low pass filter configured to attenuate certain high-frequency components out of the voltage of circuit node 136. In such an embodiment, loop filter 106 may include any suitable combination of resistors and capacitors or any other filter circuit suitable to attenuate at least one frequency component of a voltage signal at a circuit node.

The disclosed circuitry and methods for reducing jitter may provide various improvements to the functioning of CDR circuit 100, as well as allow for higher data rates, increased signal integrity, and the like, thereby improving inter-chip serial data communication as a whole. For example, in serial data communication, there is often a strong correlation between jitter and power consumption, as operation of CDR circuitry may impact power efficiency. The effects of jitter are further exacerbated as data rates increase, as analog latency inherent in the CDR circuit does not scale with the increased data rates.

The jitter reduction techniques disclosed herein, however, reshape the jitter transfer function to result in more effective noise filtering at the VCO, and shorten the loop latency to reduce the hunting jitter. For example, when a charge pump supplies a current to a circuit node, the voltage response exhibits first order settling behavior and a larger spread of energy of the voltage at the circuit node, which, in turn, results in larger loop latency and increased jitter. In the disclosed CDR circuit 100, however, control circuit 124 and charge pump 130 are configured to supply a current 134 that includes a component that is delayed, and of opposite polarity, relative to current 132. This delayed, opposite-polarity component of current 134, in various embodiments, may act to more efficiently settle the voltage response at circuit node 136 and minimize the spread of energy of the voltage at circuit node 136, resulting in decreased jitter in CDR circuit 100. Thus, in various embodiments, the disclosed techniques reduce VCO-induced jitter and hunting jitter, which results in improved power efficiency and enhanced robustness of the CDR circuit.

Figure 2:
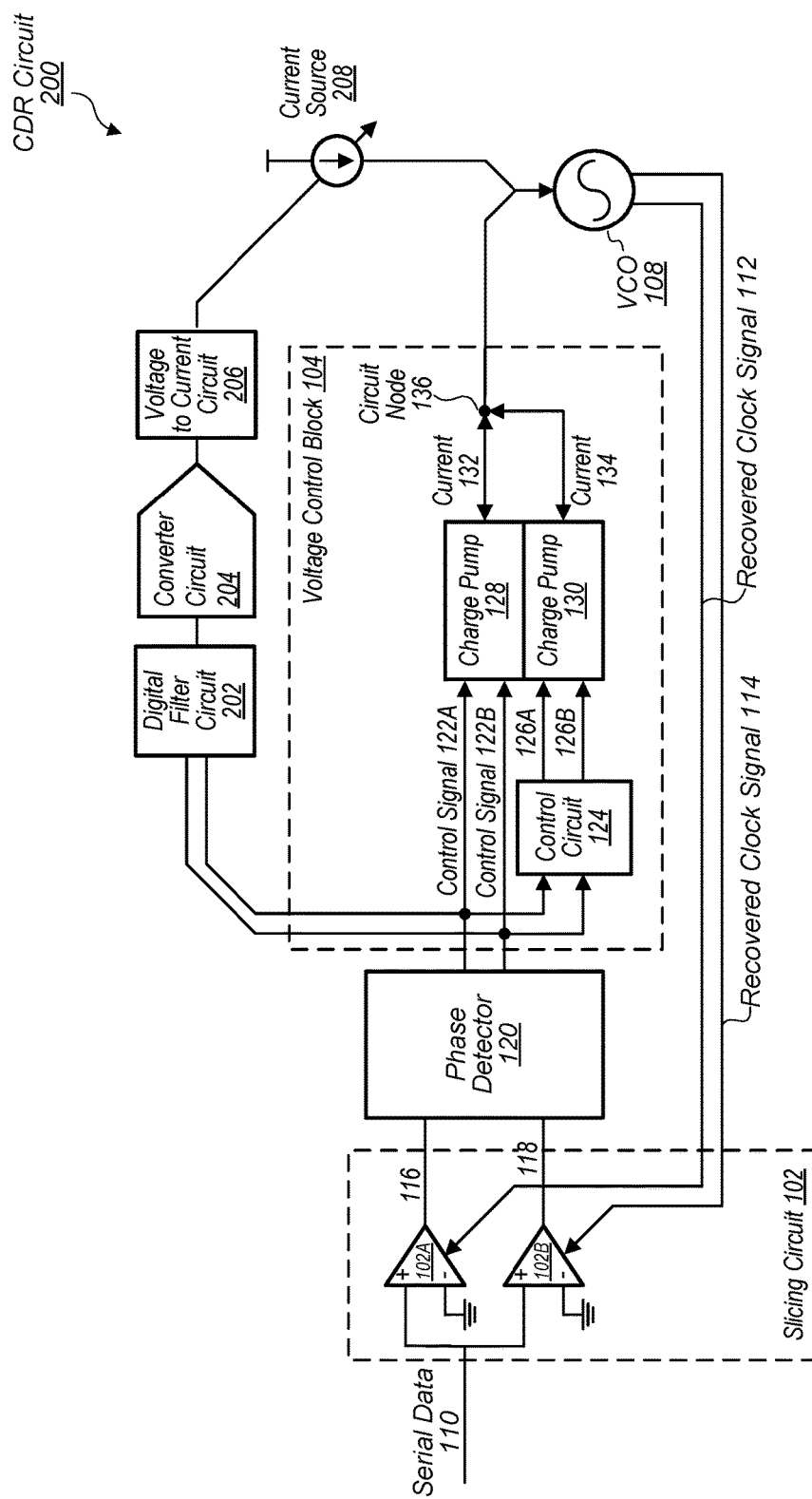
FIG. 2 is a block diagram illustrating an example CDR circuit, according to some embodiments.

Adjusting the control voltage of a VCO may be performed according to various design methodologies. For example, in some cases, the values of control signals from a phase detector may be used in conjunction with a digital-to-analog converter (DAC) to generate a current to be supplied to the circuit node, the voltage of which controls the frequency of the VCO. A particular embodiment of such a system is illustrated in FIG. 2. In various embodiments, the configuration of CDR circuit 200 depicted in FIG. 2 may offer various advantages, including area efficiency and increased immunity to noise.

In FIG. 2, an example embodiment of CDR circuit 200 is shown, according to some embodiments. In various embodiments, CDR circuit 200 may correspond to a digital implementation of the analog CDR circuit 100 depicted in FIG. 1. Accordingly, various elements of CDR circuit 200 may be configured to operate in a similar manner as corresponding elements in CDR circuit 100, as described throughout this disclosure. For example, charge pump 128 of FIG. 2 may be configured to supply a current 132 to circuit node 136 using control signals 122A and 122B generated by phase detector 120. Further, as in the embodiment depicted in FIG. 1, control circuit 124 may be configured to generate control signals 126A and 126B based on control signals 122A and 122B. In various embodiments of CDR circuit 200, charge pump 130 may be configured to use control signals 126A and 126B to supply current 134 to circuit node 136. As described above, in various embodiments, current 134 may include a component that is of opposite polarity of, and delayed relative to, current 132. This delayed, opposite-polarity component of current 134 may act to more efficiently settle the voltage response at circuit node 136, resulting in reduced jitter in the recovered clock signals 112 and 114.

In addition to the currents 132 and 134 being supplied to circuit node 136, current source 208 may also be used to supply a current to circuit node 136. Control signals 122A and 122B are filtered by digital filter circuit 202 to generate a filtered signal. In various embodiments, digital filter circuit 202 may include any suitable combination of logic gates, counters, sequential logic circuits, and the like, configured to implement a particular filtering algorithm on control signals 122A and 122B.

In the depicted embodiment, the filtered signal generated by digital filter circuit 202 is used by converter circuit 204 to generate an analog signal. Converter circuit 204 may, in various embodiments, be a particular example of a digital-to-analog converter (DAC) that is configured to set the analog signal to a particular voltage level based on the filtered signals of digital filter circuit 202.

Voltage to current converter circuit 206 may be configured to generate a second analog signal used to adjust a value of current supplied to circuit node 136 by current source 208. Each of voltage to current converter circuit 206 and current source 208 may be designed according to one of various design methodologies, and may include multiple MOSFETs or any other suitable transconductance devices.

As discussed above, control circuit 124 may be configured to generate control signals 126 based on control signals 122 received from phase detector 120, in various embodiments. The following description, with reference to FIGS. 3 and 4, describes various embodiments of control circuit 124 that may be included in a voltage control block 104 configured to modify the voltage of circuit node 136 based on control signals 122A and 122B from phase detector 120.

Figure 3:
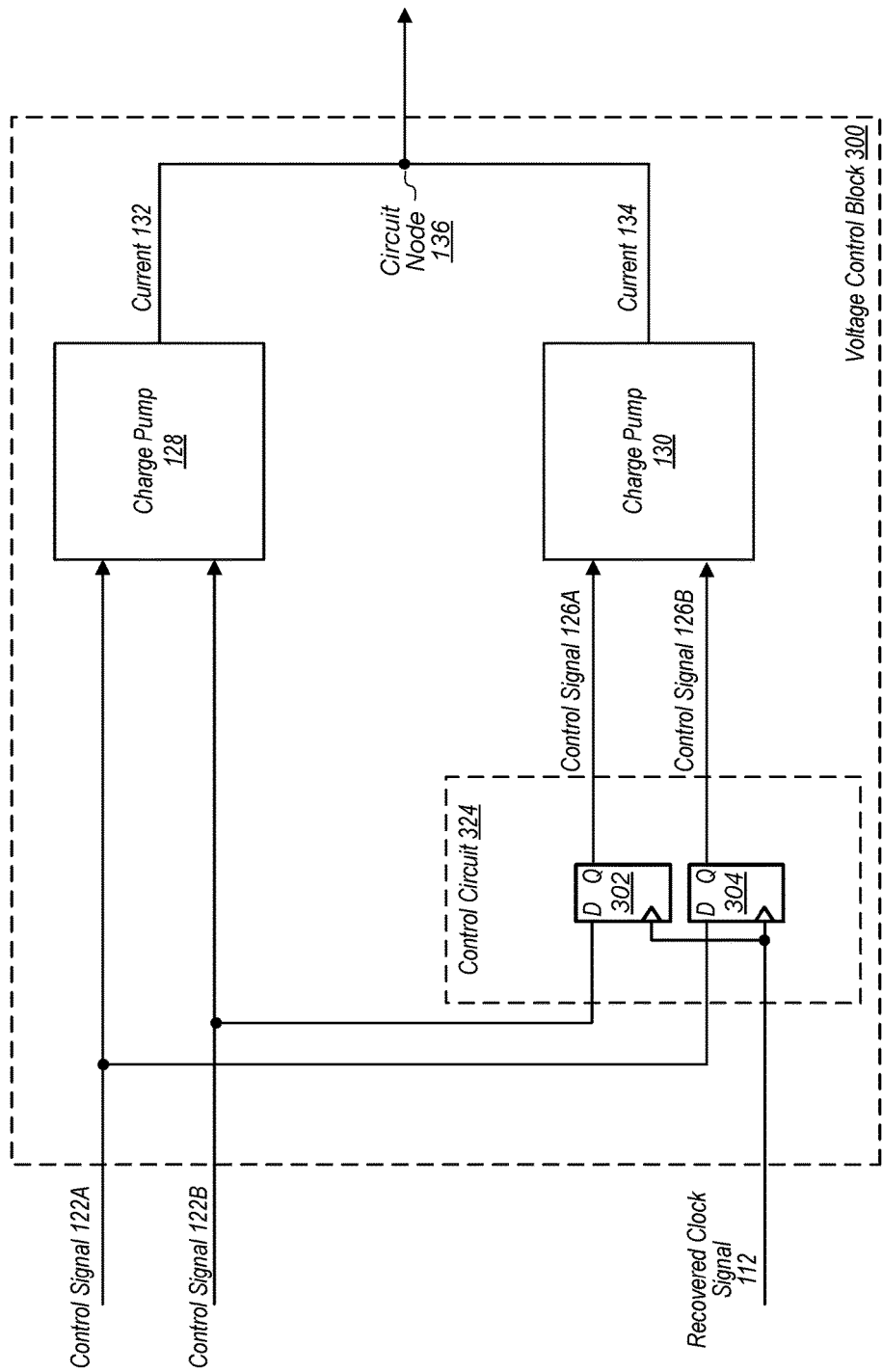
FIG. 3 is a block diagram illustrating an example voltage control block, according to some embodiments.

Referring now to FIG. 3, a block diagram of an example voltage control block 300 is depicted, according to some embodiments. In the embodiment of FIG. 3, voltage control block 300 includes control circuit 324, charge pumps 128 and 130, and circuit node 136. In some embodiments, control circuit 324 of FIG. 3 may correspond to control circuit 124 of FIG. 1.

In various embodiments, voltage control block 300 may be configured to modify the voltage of circuit node 136 based on control signals 122A and 122B from phase detector 120. As shown in FIG. 3, charge pump 128 may be configured to receive control signals 122A and 122B and generate current 132 based on control signals 122A and 122B.

Further, in various embodiments, control circuit 324 may be configured to generate control signals 126A and 126B using control signals 122A and 122B. For example, in the depicted embodiment, control circuit 324 includes flip-flops 302 and 304. In the depicted embodiment, control circuit 324 may be configured to latch a state of control signal 122A, using, for example, flip-flop 304 and recovered clock signal 112, to generate control signal 126B. Similarly, in the depicted embodiment, control circuit 324 may be configured to latch a state of control signal 122B, using, for example, flip-flop 302 and recovered clock signal 112, to generate control signal 126A. As shown in FIG. 3, charge pump 130 may be configured to generate current 134 based on control signals 126A and 126B. Note that, although control circuit 324 is shown generating control signals 126A-126B using recovered clock signal 112, in other embodiments control circuit 324 may be configured to generate control signals 126A-126B using recovered clock signal 114. For example, in such embodiments, control circuit 324 may be configured to latch a state of control signals 122 using flip-flops 302-304 and recovered clock signal 114.

In various embodiments, current 134 may include a component in which the polarity of 134 is opposite of, and delayed relative to, current 132. For example, consider an instance in which phase detector 120 determines that phases of one or more of recovered clock signals 112 and 114 lags phases of data symbols included in serial data 110. In such an instance, phase detector 120 may assert control signal 122A, which may cause charge pump 128 to source current 132 to circuit node 136. Further, control circuit 324 may be configured to latch the asserted state of control signal 122A, for example using flip-flop 304, to generate control signal 126B. In response to receiving asserted control signal 126B, charge pump 130 may be configured to supply a current 134 to circuit node 136 that includes a negative component that it delayed relative to current 132. Stated differently, based on asserted control signal 126B, charge pump 130 may be configured to sink current 134 from circuit node 136 at a time subsequent to charge pump 128 sourcing current 132 to circuit node 136.

As a further example, consider an instance in which phase detector 120 determines that the phases of the one or more of recovered clock signals 112 and 114 lead the phases of the data symbols included in serial data 110. In such an instance, phase detector 120 may assert control signal 122B, which may cause charge pump 128 to sink current 132 from circuit node 136. Further, control circuit 324 may be configured to latch the asserted state of control signal 122B, for example using flip-flop 302, to generate control signal 126A. In response to receiving asserted control signal 126A, charge pump 130 may be configured to supply a current 134 to circuit node 136 that includes a positive component that is delayed relative to current 132. Stated differently, based on asserted control signal 126A, charge pump 130 may be configured to source current 134 to circuit node 136 at a time subsequent to charge pump 128 sinking current 132 from circuit node 136. In this way, control circuit 324 and charge pump 130 may be configured to supply a current 134 that includes a component that is delayed from, and of opposite polarity to, current 132 supplied by charge pump 128. In various embodiments, such a current 134 may act to settle the voltage at circuit node 136.

Figure 4:
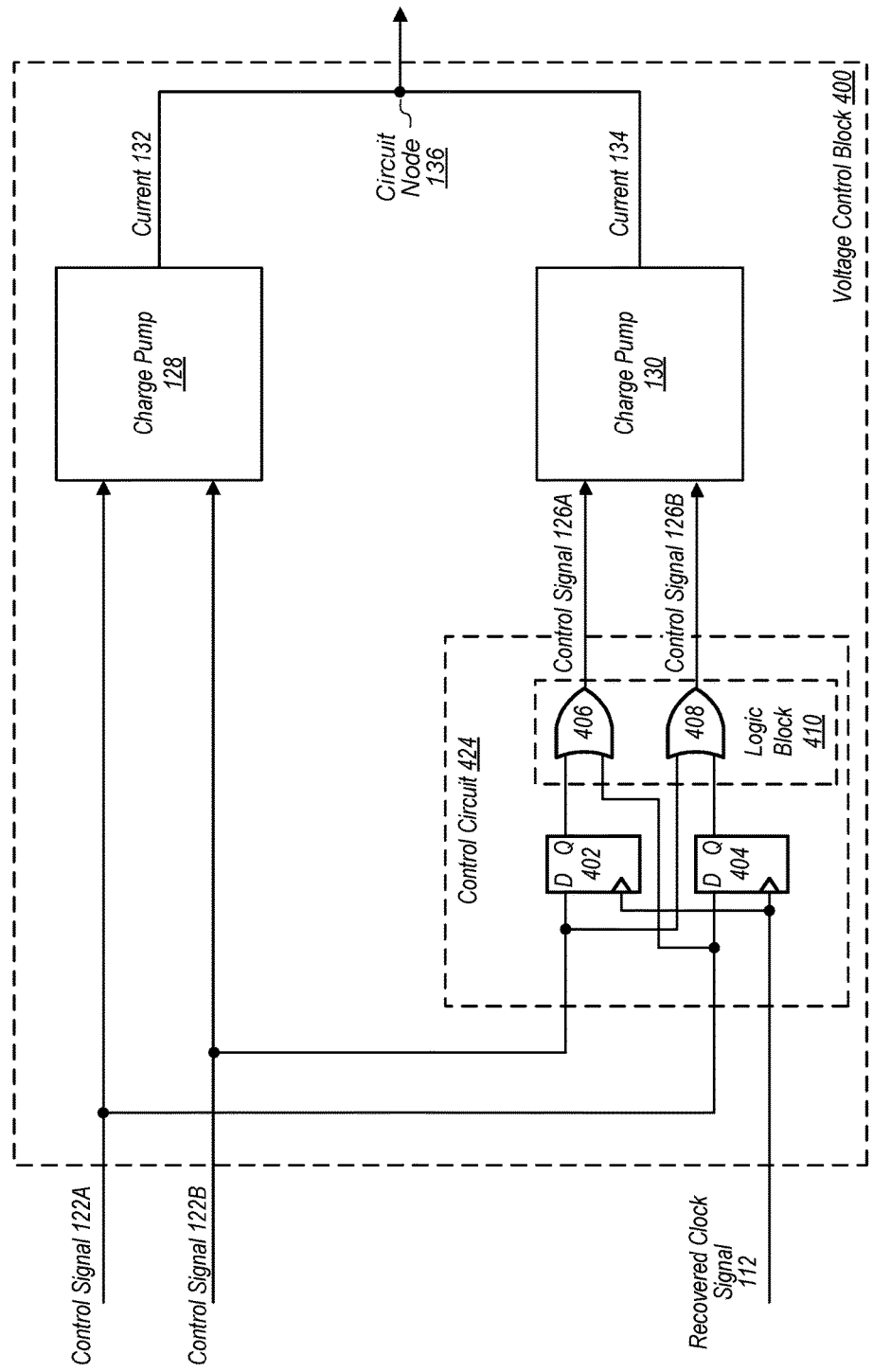
FIG. 4 is a block diagram illustrating an example voltage control block, according to some embodiments.

Turning now to FIG. 4, an example voltage control block 400 is depicted, according to some embodiments. Voltage control block 400 depicts control circuit 424 as an alternative embodiment to control circuit 324 depicted in FIG. 3. In various embodiments, control circuits 324 or 424 may be implemented to generate control signals 126A-126B to modify a voltage of circuit node 136. As shown in FIG. 4, voltage control block 400 includes control circuit 424, charge pumps 128 and 130, and circuit node 136. In some embodiments, control circuit 424 of FIG. 4 may correspond to control circuit 124 of FIG. 1.

In various embodiments, voltage control block 400 may be configured to modify the voltage of circuit node 136 based on control signals 122A and 122B from phase detector 120. Similar to voltage control block 300 of FIG. 3, charge pump 128 in voltage control block 400 may be configured to receive control signals 122A and 122B and generate current 132 based on control signals 122A and 122B.

Voltage control block 400 further includes control circuit 424. Similar to the embodiment depicted in FIG. 3, control circuit 424 may, in various embodiments, be configured to generate control signals 126A and 126B using control signals 122A and 122B. Control signals 126A and 126B may be used by charge pump 130 to supply current 134 to circuit node 136. Note, however, the configuration of control circuit 424 depicted in FIG. 4. As shown in FIG. 4, control circuit 424 includes flip-flops 402 and 404 and logic block 410, which logically combines outputs of flip-flops 402 and 404, and control signals 122A and 122B to generate control signals 126A and 126B. In the depicted embodiment, logic block 410 includes OR gates 406 and 408, although, in other embodiments, any suitable combination of logic gates may be employed.

It is noted that static complementary metal-oxide semiconductor (CMOS) OR gates, such as OR gates 406 and 408, may be implemented in particular embodiments of logic block 410 configured to perform a logic OR operation that may be employed in the embodiments described herein. In other embodiments, however, any suitable configuration of logic circuits capable of performing a logic OR operation may be used, including OR gates built using technology other than CMOS.

In various embodiments, control circuit 424 may be configured to latch a state of control signal 122A, for example using flip-flop 404 and recovered clock signal 112, to generate a latched version of control signal 122A. Similarly, control circuit 424 may be configured to latch a state of control signal 122B, for example using flip-flop 402 and recovered clock signal 112, to generate a latched version of control signal 122B. Note, however, that although the depicted embodiment of control circuit 424 uses recovered clock signal 112 to latch a state of control signals 122, in other embodiments control circuit 424 may be configured to latch a state of control signals 122 using recovered clock signal 114.

Control circuit 424 further includes logic block 410, which may be configured to logically combine control signals 122A and 122B with the latched versions of control signals 122A and 122B to generate control signals 126A and 126B, as shown in FIG. 4. For example, control signal 122B and the latched version of control signal 122A may be logically combined using OR gate 408 to generate control signal 126B. Similarly, control signal 122A and the latched version of control signal 122B may be logically combined using OR gate 406 to generate control signal 126A. Note, however, that this configuration of logic block 410 is provided merely as an example and other arrangements of logical components may be implemented in accordance with embodiments of this disclosure. In general, any configuration of flip-flops and logical components suitable to supply control signals 126A and 126B to a charge pump 130 may be implemented without departing from the scope of this disclosure.

As shown in FIG. 4, charge pump 130 may be configured to generate current 134 based on control signals 126A and 126B. In various embodiments, current 134 may have multiple components that vary in polarity over time. For example, in some embodiments, charge pump 130 may be configured to generate current 134 with two components: a component that is of the same polarity as, and not delayed relative to, current 132, and a component that is of opposite polarity, and delayed relative to, current 132. Example relationships between the control signals 122 and 126 and currents 132 and 134 depicted in FIGS. 3 and 4 are described in more detail below with reference to FIGS. 5A and 5B, according to some embodiments.

Figure 5A:
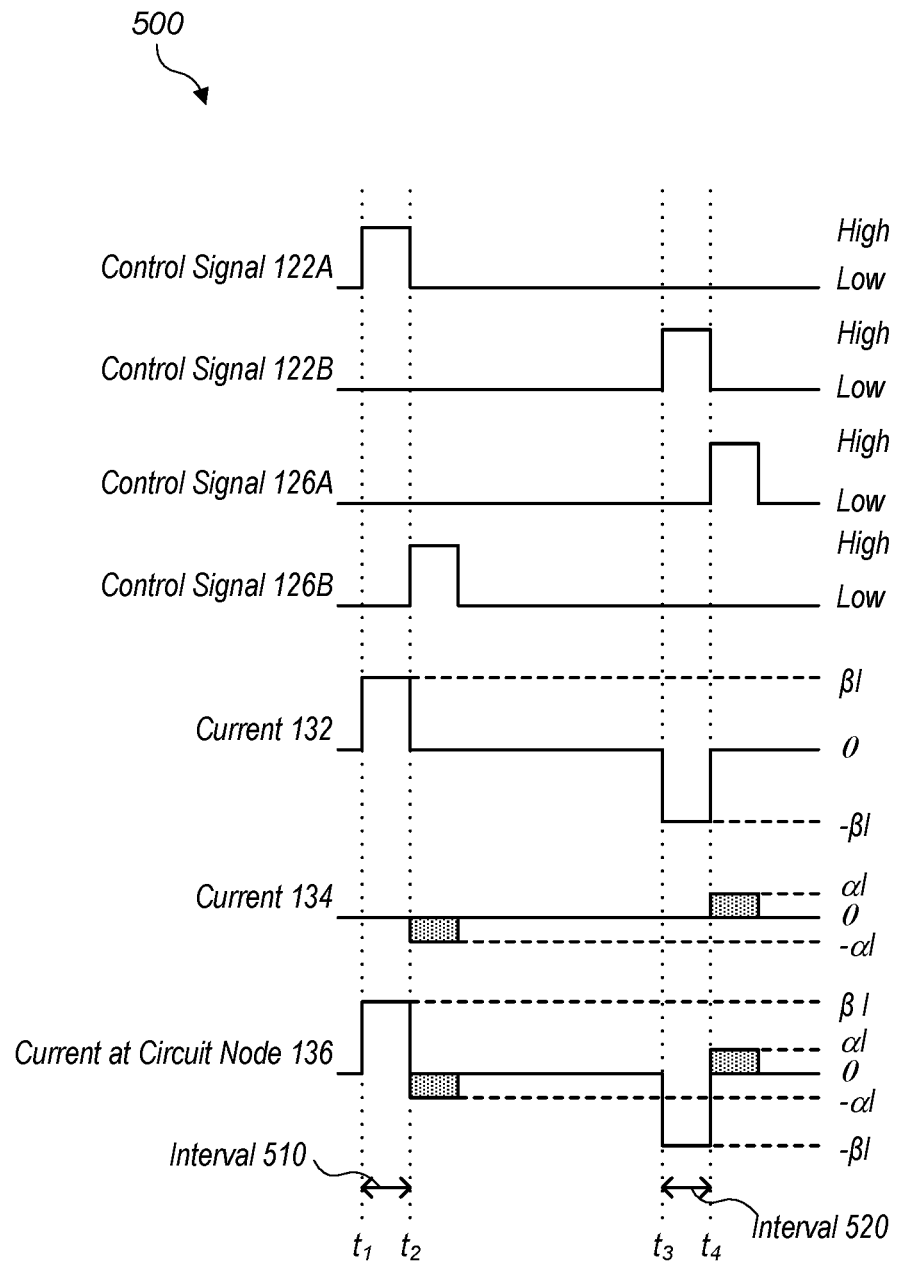
FIGS. 5A and 5B depict example timing diagrams of control signals and currents, according to some embodiments.
Figure 5B:
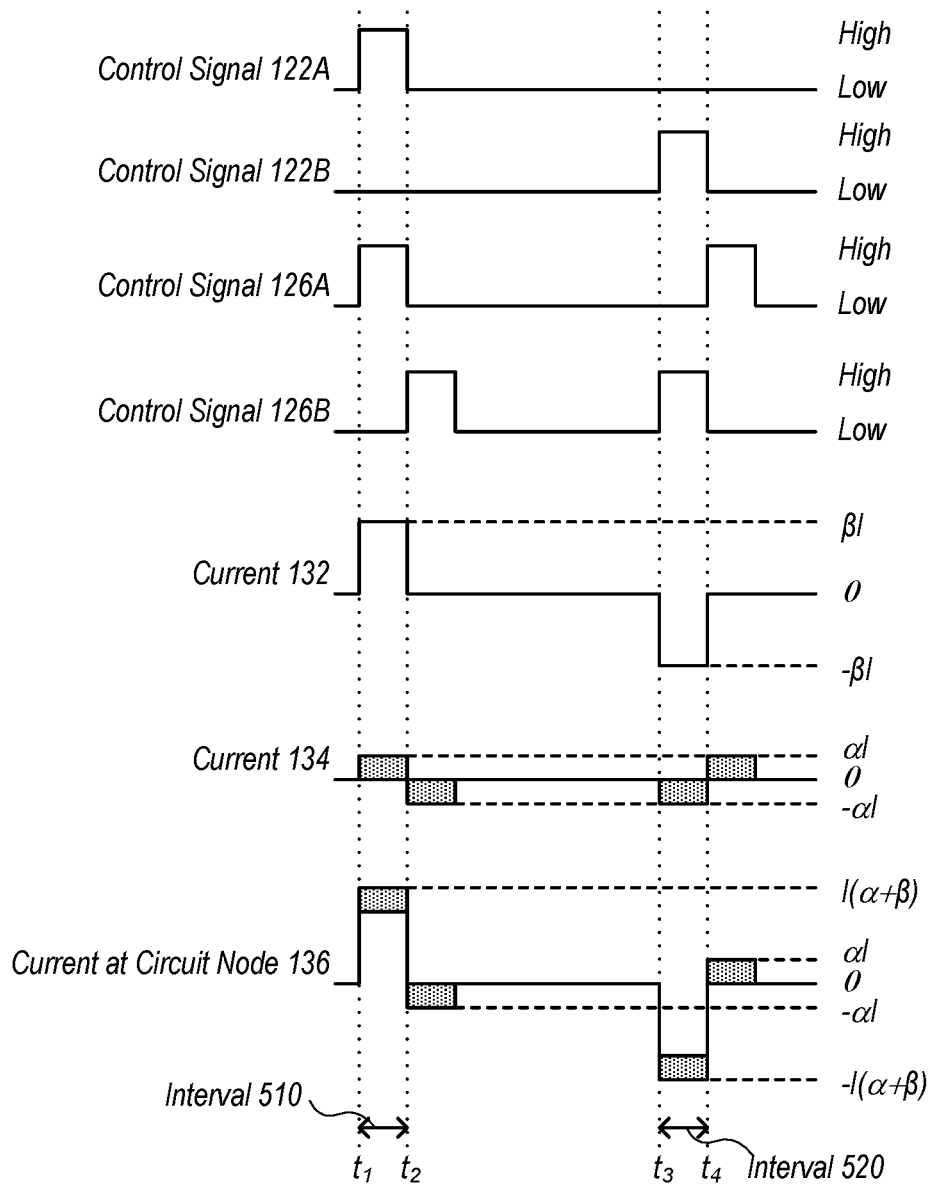

Referring now to FIGS. 5A and 5B, timing diagrams 500 and 550 are respectively depicted. Timing diagrams 500 and 550 illustrate example sequences for various control signals and currents in CDR circuit 100, according to some embodiments. More specifically, FIG. 5A shows timing diagram 500, which may correspond to a timing sequence for control signals 122A-122B and 126A-126B and currents 132 and 134 depicted in voltage control block 300 of FIG. 3, according to some embodiments. Further, FIG. 5B shows timing diagram 550, which may correspond to a timing sequence for control signals 122A-122B and 126A-126B and currents 132 and 134 depicted in voltage control block 400 of FIG. 4, according to some embodiments.

Turning now to FIG. 5A, timing diagram 500 shows idealized waveforms for each of: control signals 122A, 122B, 126A, 126B, and currents 132 and 134. Further, timing diagram 500 shows an idealized waveform for the current at circuit node 136, which may be the sum of currents 132 and 134 according to various embodiments.

In FIG. 5A, control signal 122A is asserted at time $t_1$, as indicated by the transition from a low to high state. In some embodiments, for example, phase detector 120 may assert control signal 122A based on a comparison of the phases of sampled data signals 116 and 118, where asserting control signal 122A may correspond to a determination that VCO 108 needs to increase the frequency of recovered clock signals 112 and 114. Further, as shown in FIG. 5A and described above with reference to FIG. 3, the assertion of control signal 122A may result in charge pump 128 sourcing current 132 to circuit node 136. As discussed in more detail below with regard to FIGS. 6A and 6B, charge pump 128 may be configured to scale the magnitude of current 132 supplied to circuit node 136. In the depicted embodiments, the magnitude of current 132 is scaled by a factor β.

After the assertion of control signal 122A and the sourcing of current 132, control circuit 324 may be configured to assert control signal 126B, as shown at $t_2$ in FIG. 5A. In various embodiments, control circuit 324 may be configured to assert control signal 126B based on a transition (e.g., a rising edge or falling edge) of recovered clock signal 112. For example, as shown in FIG. 3, flip-flop 304 may be configured to latch the asserted state of control signal 122A based on a transition of recovered clock signal 112, which may cause control signal 126B to be asserted. Further, as shown in FIG. 5A and described above with reference to FIG. 3, the assertion of control signal 126B may cause charge pump 130 to sink current 134 from circuit node 136. That is, based on control signal 126B, charge pump 130 may be configured to supply current 134 to circuit node 136, where current 134 includes a component that is of opposite polarity and delayed relative to current 132. Further, as discussed in more detail below, charge pump 130 may be configured to scale the magnitude of current 134 supplied to circuit node 136. In the depicted embodiment, the magnitude of current 134 is scaled by a factor α.

Further, as depicted in FIG. 5A, control signal 122B is asserted at a time $t_3$, as indicated by the transition from a low to high state. In some embodiments, for example, phase detector 120 may assert control signal 122B based on a comparison of the phases of sampled data signals 116 and 118, where asserting control signal 122B may correspond to a determination that VCO 108 needs to decrease the frequency of recovered clock signals 112 and 114. Further, as shown in FIG. 5A and described above with reference to FIG. 3, the assertion of control signal 122B may result in charge pump 128 sinking current 132 from circuit node 136. For example, in the depicted embodiment, charge pump 128 may be configured to sink a current 132 from circuit node 136, where the magnitude of current 132 may be scaled by a factor of β.

After the assertion of control signal 122B and the sinking of current 132, control circuit 324 may be configured to assert control signal 126A, as shown at $t_4$ in FIG. 5A. In various embodiments, control circuit 324 may be configured to assert control signal 126A based on a transition of recovered clock signal 112. For example, as shown in FIG. 3, flip-flop 302 may be configured to latch the asserted state of control signal 122B based on a transition of recovered clock signal 112, which may cause control signal 126A to be asserted. Further, as shown in FIG. 5A and described above with reference to FIG. 3, the assertion of control signal 126B may cause charge pump 130 to source current 134 to circuit node 136. That is, based on control signal 126A, charge pump 130 may be configured to supply current 134 to circuit node 136, where current 134 includes a component that is of opposite polarity and delayed relative to current 132. Further, as shown in FIG. 5A, charge pump 130 may be configured to scale the magnitude of current 134 supplied to circuit node 136 (e.g., by a factor of α in the depicted embodiment).

Note that, in FIG. 5A-5B, the intervals 510 and 520 between current 132 being supplied to circuit node 136 and the opposite-polarity component of current 134 being supplied to circuit node 136 are labeled intervals 510 and 520. In some embodiments, intervals 510 and 520 may be equal to 1-UI, where UI is the unit interval of serial data 110. Note, however, that these intervals 510 and 520 are provided merely as examples and other time periods of delay between current 132 being supplied to circuit node 136 and the opposite-polarity component of current 134 being supplied to circuit node 136 may be used, for example depending on the characteristics of the particular system in which CDR circuit 100 is implemented.

FIG. 5A further depicts an idealized waveform for the current at circuit node 136. In various embodiments, the current at circuit node 136 may be a sum of the currents 132 and 134. Thus, in the depicted waveform, the individual contributions of currents 132 and 134 to the current at circuit node 136 are shown. For example, at times $t_1$ and $t_2$, the waveform for the current at circuit node 136 depicts the positive current 132 supplied by charge pump 128 and the negative current 134 supplied by charge pump 130, respectively. Similarly, at times $t_3$ and $t_4$, the waveform for the current at circuit node 136 depicts the negative current 132 and the positive current 134, respectively. In various embodiments, the delayed, opposite-polarity component of current 134 may act to more efficiently settle the voltage response at circuit node 136, which in turn may result in decreased jitter in CDR circuit 100.

Referring now to FIG. 5B, timing diagram 550 similarly shows idealized waveforms for each of: control signals 122A, 122B, 126A, 126B, currents 132 and 134, and the current at circuit node 136, according to various embodiments of voltage control block 400 in FIG. 4. Timing diagram 550 of FIG. 5B includes various similarities to timing diagram 500 of FIG. 5A, and thus the description that follows will accordingly include some overlap with the description of FIG. 5A. Note, however, the differences in operation of control signals 126A and 126B, and the components of current 134 generated by charge pump 130 based on control signals 126A and 126B. Specifically, the embodiment shown in FIG. 5B depicts current 134 with both a component that is of the same polarity and not delayed relative to current 132, and a component that is of opposite polarity and delayed relative to current 132.

In FIG. 5B, control signal 122A is asserted at time $t_1$. In some embodiments, for example, phase detector 120 may assert control signal 122A based on a comparison of the phases of sampled data signals 116 and 118, where asserting control signal 122A may correspond to a determination that VCO 108 needs to increase the frequency of recovered clock signals 112 and 114. Further, as shown in FIG. 5B and described above with reference to FIG. 4, the assertion of control signal 122A may result in charge pump 128 sourcing current 132 to circuit node 136. In the depicted embodiments, the magnitude of current 132 is scaled by a factor $\beta$.

Further, as shown in FIG. 5B, control signal 126A is also asserted at time $t_1$. For example, in FIG. 4, control signal 122A is shown as an input to OR gate 406 of logic block 410. Thus, in the depicted embodiment, the assertion of control signal 122A may generate a corresponding assertion of control signal 126A. The asserted state of control signal 126A may result in charge pump 130 sourcing current 134 to circuit node 136. Stated differently, charge pump 130 may be configured to supply a component of current 134 to circuit node 136 using control signal 126A, where that component is of the same polarity and not delayed relative to current 132. In the depicted embodiment, the magnitude of current 134 is scaled by a factor $\alpha$. Thus, in the embodiment of FIG. 5B, both charge pumps 128 and 130 source a current to circuit node 136 at time $t_1$.

After the sourcing of currents 132 and 134, control circuit 424 may be configured to assert control signal 126B, as shown at time $t_2$ in FIG. 5B. In various embodiments, control circuit 424 may be configured to assert control signal 126B based on a transition of recovered clock signal 112.

For example, as shown in FIG. 4, flip-flop 404 may be configured to latch the asserted state of control signal 122A based on a transition of recovered clock signal 112 to generate a latched version of control signal 122A. The latched version of control signal 122A may be logically combined with control signal 122B to generate control signal 126B. In the depicted embodiment, the asserted state of the latched version of control signal 122A may cause control signal 126B to be asserted. Further, as shown in FIG. 5B and described above with reference to FIG. 4, the assertion of control signal 126B may cause charge pump 130 to sink current 134 from circuit node 136. That is, based on control signal 126B, charge pump 130 may be configured to supply current 134 to circuit node 136, where current 134 includes a component that is of opposite polarity and delayed relative to current 132.

Further, as depicted in FIG. 5B, control signal 122B is asserted at a time $t_3$. In some embodiments, for example, phase detector 120 may assert control signal 122B based on a comparison of the phases of sampled data signals 116 and 118, where asserting control signal 122B may correspond to a determination that VCO 108 needs to decrease the frequency of recovered clock signals 112 and 114. Further, as shown in FIG. 5B and described above with reference to FIG. 4, the assertion of control signal 122B may result in charge pump 128 sinking current 132 from circuit node 136. For example, in the depicted embodiment, charge pump 128 may be configured to sink a current 132 from circuit node 136, where the magnitude of current 132 may be scaled by a factor $\beta$.

Additionally, as shown in FIG. 5B, control signal 126B is also asserted at time $t_3$. For example, in FIG. 4, control signal 122B is shown as an input to OR gate 408 of logic block 410. Thus, in the depicted embodiment, the assertion of control signal 122B may generate a corresponding assertion of control signal 126B. The asserted state of control signal 126B may result in charge pump 130 sinking current 134 from circuit node 136. Stated differently, charge pump 130 may be configured to supply a component of current 134 to circuit node 136 using control signal 126B, where that component is of the same polarity and not delayed relative to current 132. Thus, in the depicted embodiment, both charge pumps 128 and 130 sink a current from circuit node 136 at time $t_3$.

After the sinking of currents 132 and 134, control circuit 424 may be configured to assert control signal 126A, as shown at time $t_4$ in FIG. 5B. In various embodiments, control circuit 424 may be configured to assert control signal 126A based on a transition of recovered clock signal 112. For example, as shown in FIG. 4, flip-flop 402 may be configured to latch the asserted state of control signal 122B based on a transition of recovered clock signal 112 to generate a latched version of control signal 122B. The latched version of control signal 122B may be logically combined with control signal 122A to generate control signal 126A. In the depicted embodiment, the asserted state of the latched version of control signal 122B may cause control signal 126A to be asserted. Further, as shown in FIG. 5B and described above with reference to FIG. 4, the assertion of control signal 126A may cause charge pump 130 to source current 134 to circuit node 136. That is, based on control signal 126A, charge pump 130 may be configured to supply current 134 to circuit node 136, where current 134 includes a component that is of opposite polarity and delayed relative to current 132.

Thus, as shown in FIG. 5B, charge pump 130 may be configured to supply a current 134 with two components:

one component that is of the same polarity and is not delayed relative to current 132, and one component that is of opposite polarity and is delayed relative to current 132. As shown in FIG. 5B, in some embodiments, the absolute value of the magnitudes of both of these components of current 134 may be equal, although opposite in polarity. In various situations, the embodiment depicted in FIG. 5B may allow for the independent control of the effective bandwidth of CDR circuit 100 (e.g., the bang-bang frequency ("$f_{bb}$") of CDR circuit 100) and the signal settling time of the voltage of circuit node 136. Note, however, that FIG. 5B merely depicts one embodiment of the magnitudes of the components of current 134. In other embodiments, the magnitudes of the components of current 134 may differ from each other.

Figure 6:
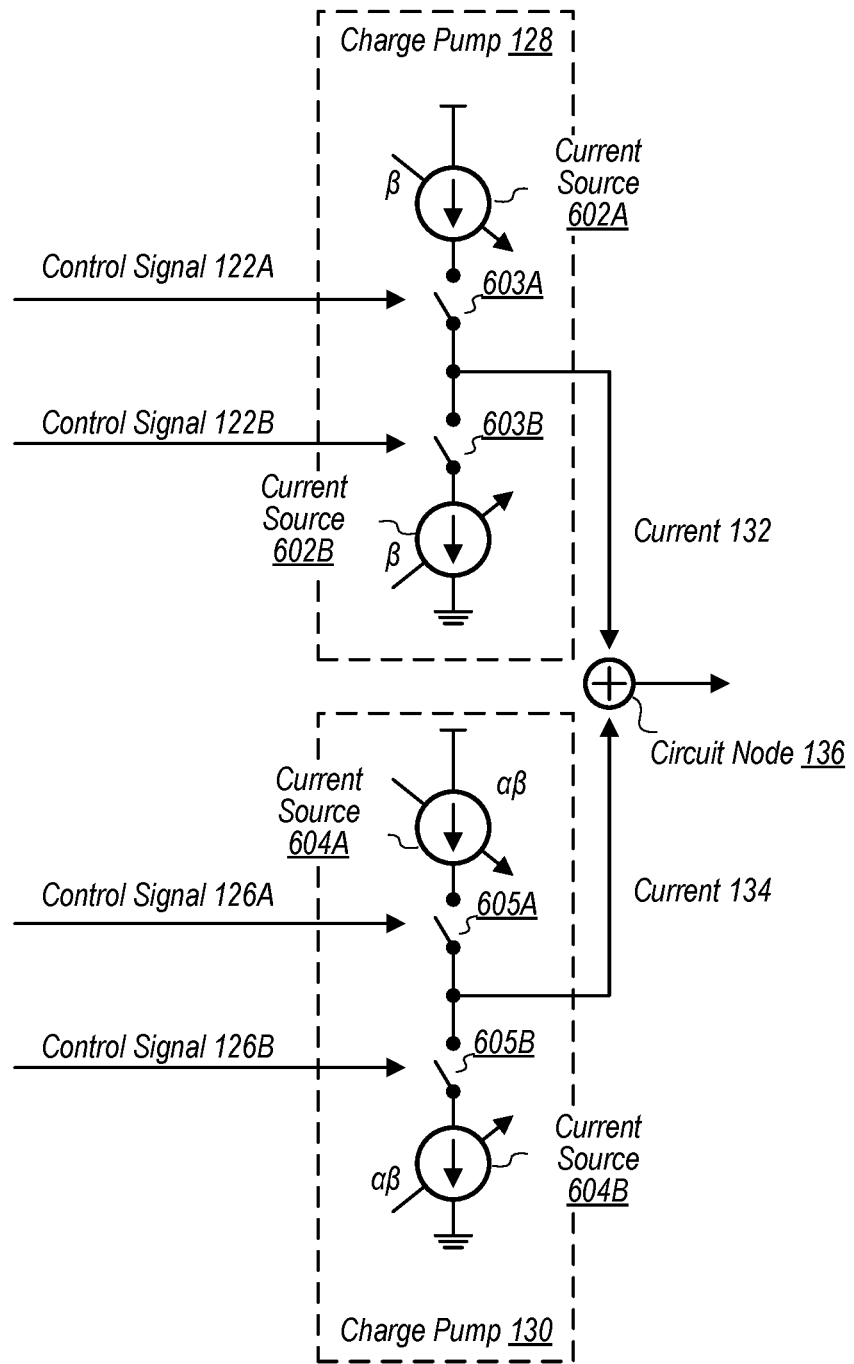
FIG. 6 is a block diagram illustrating example charge pumps, according to some embodiments.

Turning now to FIG. 6, a block diagram is shown of example charge pumps 128 and 130, according to some embodiments. In the embodiment of FIG. 6, charge pumps 128 and 130 are bilateral charge pumps configured to supply currents 132 and 134 to circuit node 136 based on control signals 122 and 126, respectively.

As shown in FIG. 6, charge pump 128 includes current sources 602A and 602B, with a switch 603A between current source 602A and circuit node 136, and a switch 603B between current source 602B and circuit node 136. In the depicted embodiment, control signals 122A and 122B may be configured to control the operation of switches 603A and 603B, respectively, such that the assertion of control signal 122A closes switch 603A and sources current 132 to circuit node 136, and the assertion of control signal 122B closes switch 603B and sinks current 134 from circuit node 136. Similarly, charge pump 130 includes current sources 604A and 604B, with a switch 605A between current source 604A and circuit node 136, and a switch 605B between current source 604B and circuit node 136. In the depicted embodiment, control signals 126A and 126B may be configured to control the operations of switches 605A and 605B, respectively, such that the assertion of control signal 126A closes switch 605A and sources current 134 to circuit node 136, and the assertion of control signal 126B closes switch 605B and sinks current 134 from circuit node 136. Switches 603 and 605 may, in some embodiments, be implemented using one or more transistors, such as a metal-oxide-semiconductor field effect transistor ("MOSFET"). Note, however, that this is provided merely as an example, and any suitable switching component may be implemented in accordance with various embodiments.

As noted above, in various embodiments, charge pumps 128 and 130 may be configured to adjust the magnitudes of the currents 132 and 134 supplied to circuit node 136. For example, in some embodiments, the magnitude of the components of current 134 may be less than the magnitude of current 132. Further, in various embodiments, the settling effect of the delayed, opposite-polarity component of current 134 may vary based on the ratio of the magnitudes of currents 132 and 134. Thus, in various embodiments, the magnitudes of currents 132 and 134 may be adjusted such that a ratio α between the magnitudes is achieved. In some embodiments, this ratio α may be adjusted such that the energy spread of the voltage at the circuit node is reduced to two unit intervals. Therefore, in some embodiments, charge pump 130 may be configured to scale the magnitude of current 134 based on a ratio α.

In cases where a bang-bang type phase detector is employed, it may be desirable to scale the magnitude of both currents 132 and 134 to maintain the bang-bang frequency ("$f_{bb}$") of CDR circuit 100. Thus, in some embodiments, charge pump 128 may be configured to scale the magnitude of current 132 by a factor β, and charge pump 130 may be configured to scale the magnitude of current 134 by a factor of α and β, as shown in FIGS. 6A and 6B. In some embodiments, the relationship of α and β may be described as follows:

$$H(z) = \beta + \alpha z^{-1} \quad (2)$$

$$\alpha = -\beta e^{\left(\frac{-UI}{\tau}\right)} \quad (3)$$

$$\beta = \frac{f_{bb}}{1 - e^{\left(\frac{-UI}{\tau}\right)}} \quad (4)$$

Where H(z) is the jitter transfer function and τ is the time constant of the voltage response of circuit node 136, which may be used as the control voltage for VCO 108, according to some embodiments. Thus, as demonstrated by the above equations, the magnitude of the second current may, in some embodiments, be scaled by a factor that is based on a duration of a data symbol in the input serial data and a time constant of the loop filter of the CDR circuit 100. Similarly, in various embodiments, the magnitude of the first current may also be scaled by a factor that is based on a duration of a data symbol in the input serial data and a time constant of the loop filter. Note that, in some embodiments, charge pumps 128 and 130 may be configured to adjust the magnitudes of the currents 132 and 134, for example based on pre-calculated simulations of CDR circuit 100, or based on performance during operation. Further, the magnitudes of currents 132 and 134 may be further optimized based on various factors, including the settling time of the voltage of circuit node 136, the total jitter of one or more of recovered clock signals 112 and 114, the bit error of the receiver circuit block, etc.

In the illustrated embodiment, current sources 602A, 602B, 604A, and 604B are depicted as being adjustable current sources to allow for the aforementioned current scaling. The current supplied by such adjustable current sources may be adjusted using any one of a variety of suitable methods. For example, in some embodiments, the current of an adjustable current source may be modified by adjusting a voltage level of a control or bias signal. Alternatively, an adjustable current source may include multiple fixed current sources, each coupled to a respective switch controlled by a corresponding bit of a control word.

Figure 7:
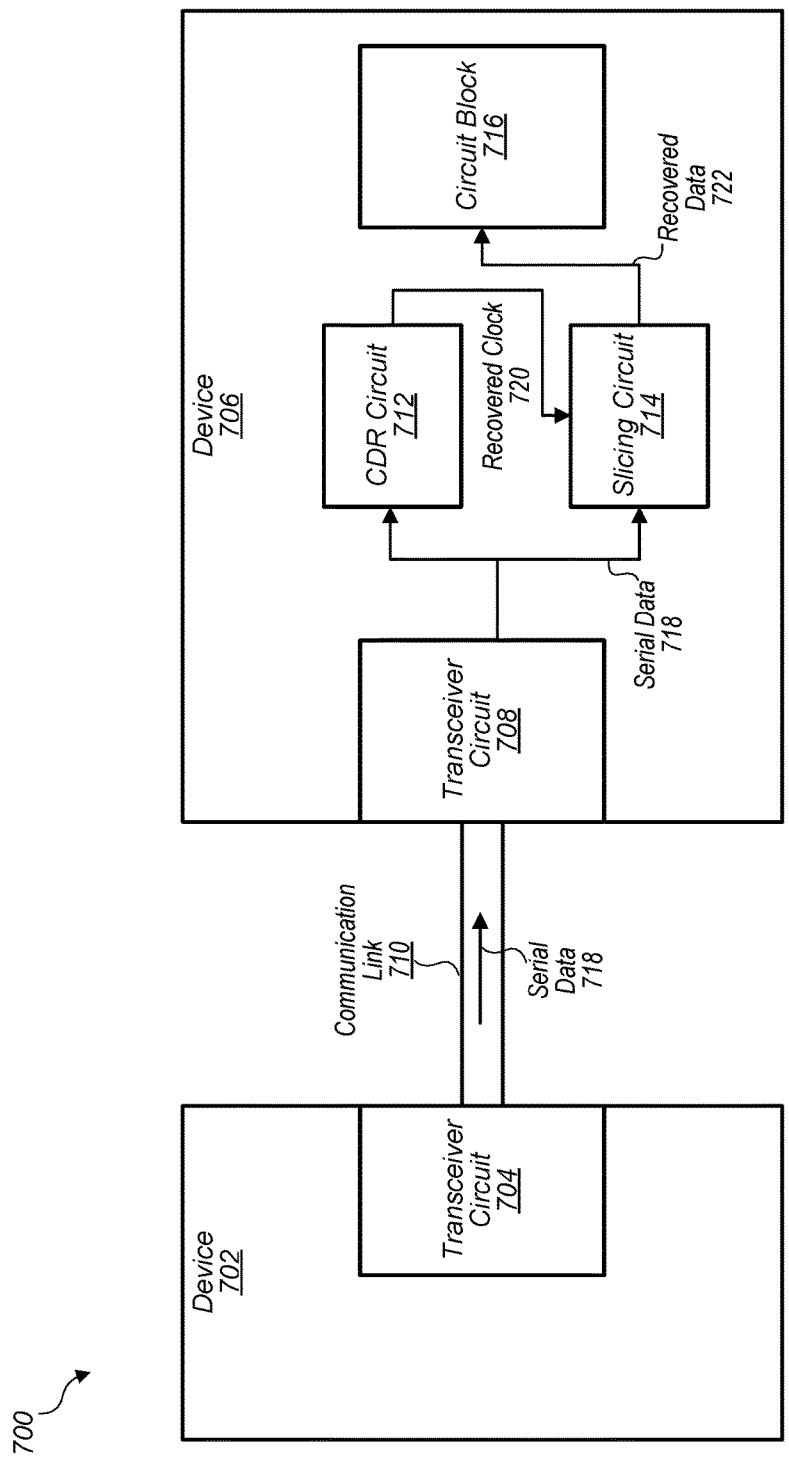
FIG. 7 is a block diagram illustrating an example computing system, according to some embodiments.

Referring now to FIG. 7, a block diagram of an example computing system 700 is shown. In various embodiments, computing system 700 may correspond to any of various computing systems in which the disclosed circuitry may be implemented, such as, e.g., a desktop computer, a notebook computer, a tablet computer, a smartphone, a wearable computing device, or any other suitable mobile computing device.

As shown in FIG. 7, computing system 700 includes devices 702 and 706. In various embodiments, devices 702 and 706 may refer to any of various computing devices included in a computing system 700, such as a processor core, a memory device, an I/O device, a storage device, a graphics processor, etc. In various embodiments, devices 702 and 706 may be configured to communicate via communication link 710. For example, in the depicted embodiment, device 702 may be configured to transmit, using transceiver circuit 704, serial data 718 to device 706. Device 706 may, in turn, be configured to receive serial data 718, using transceiver circuit 708, generate recovered data 722 from serial data 718 using CDR circuit 712 and slicing circuit 714, and provide the recovered data 722 to circuit block 716. In various embodiments, circuit block 716 may be any of various circuits included in the above-mentioned computing devices, such as a digital signal processing block, etc. It is noted that although communication link 710 is depicted as including two wires in the illustrated embodiment, in other embodiments, any suitable number of wires may be included in communication link 710.

In computing system 700, device 706 includes CDR circuit 712. In various embodiments, CDR circuit 712 may correspond to CDR circuit 100 or CDR circuit 200 as described above. Accordingly, in various embodiments, CDR circuit 712 may be configured to operate as disclosed herein to reduce jitter in recovered clock 720 (which may correspond to recovered clock signal 112 or 114), allowing for improved communication between devices 702 and 706 of computing system 700. Recovered clock 720 may then be used, for example by slicing circuit 714, to sample serial data 718 to generate recovered data 722. Note that, although shown separately in FIG. 7, slicing circuit 714 may be included as part of CDR circuit 712 in some embodiments.

Example Methods

Figure 8:
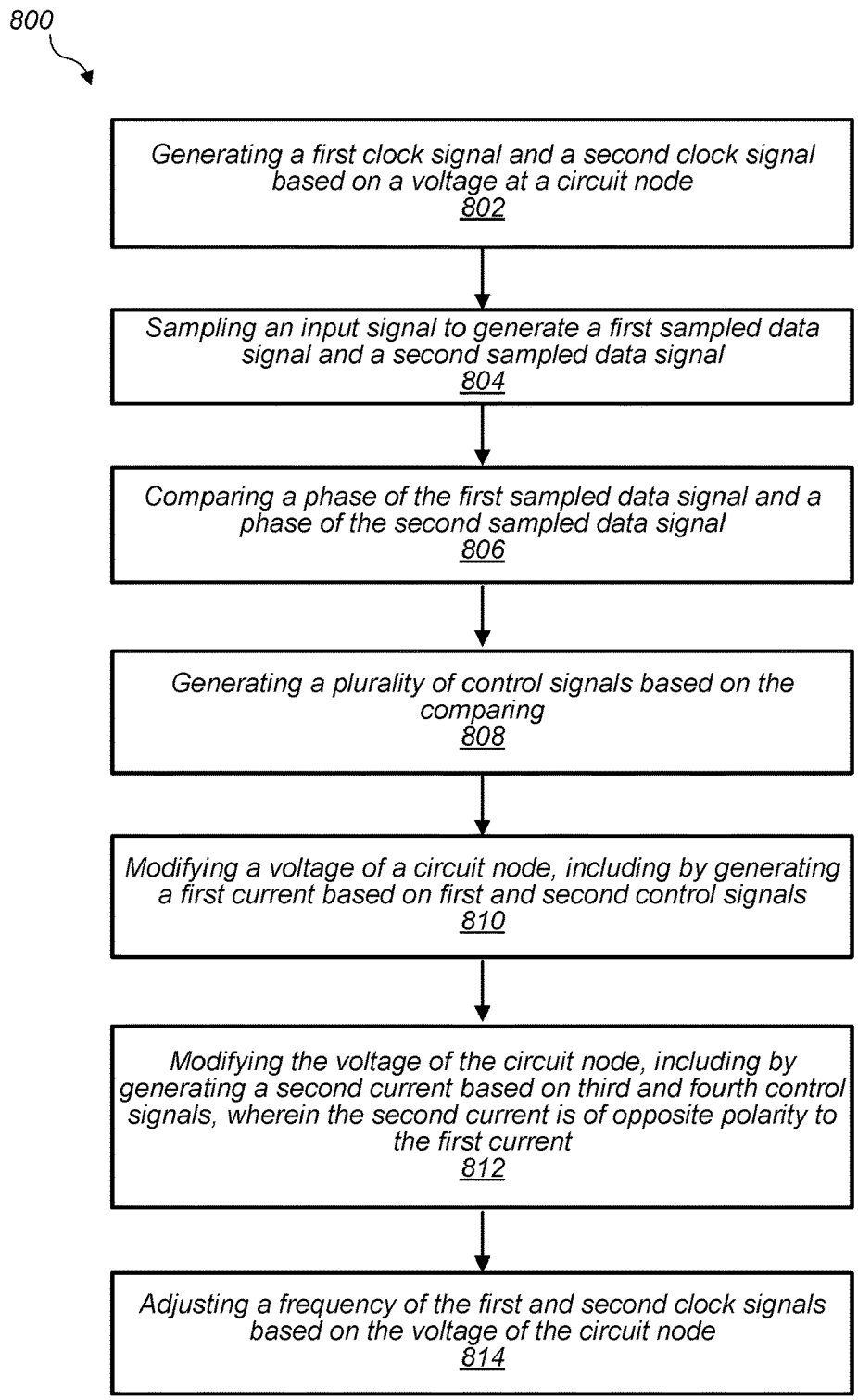
FIG. 8 is a flow diagram illustrating an example method for reducing jitter in a CDR circuit, according to some embodiments.

Turning now to FIG. 8, a flow diagram of an example method 800 for reducing jitter in a CDR circuit is shown, according to some embodiments. In various embodiments, method 800 may be implemented, for example, by CDR circuit 100 of FIG. 1. FIG. 7 includes blocks 802-814. While these blocks are shown in a particular order for ease of understanding, other orders may be used.

Block 802 includes generating a first clock signal and a second clock signal based on a voltage at a circuit node. For example, with reference to FIG. 1, VCO 108 may be configured to generate recovered clock signals 112 and 114 based on a voltage of circuit node 136.

Method 800 then proceeds to block 804, which includes sampling an input signal to generate a first sampled data signal and a second sampled data signal. For example, in some embodiments, slicing circuit 102 may be configured to sample serial data 110 using recovered clock signals 112 and 114, respectively, to generate sampled data signals 116 and 118.

Method 800 then proceeds to block 806, which includes comparing a phase of the first sampled data signal and a phase of the second sampled data signal. For example, in some embodiments, phase detector 120 may be configured to compare the phases of the sampled data signals 116 and 118. Method 800 then proceeds to block 808, which includes generating a plurality of control signals based on the comparing. In some embodiments, for example, phase detector may be configured to generate control signals 122A and 122B based on a result of the comparison between the phases of sampled data signals 116 and 118.

Method 800 then proceeds to block 810, which includes modifying a voltage of a circuit node, including by generating a first current based on first and second control signals of the plurality of control signals. For example, charge pump 128 may be configured to modify the voltage of circuit node 136 by generating current 132 and supplying current 132 to circuit node 136, according to some embodiments. Method 800 then proceeds to block 812, which includes modifying the voltage of the circuit node, including by generating a second current that is based on third and fourth control signals of the plurality of control signals. In some embodiments, for example, control circuit 124 may be configured to generate control signals 126A and 126B based on control signals 122A and 122B. Further, in such embodiments, charge pump 130 may be configured to generate current 134 based on control signals 126A and 126B. In various embodiments, the polarity of current 134 may be opposite of the polarity of current 132.

Method 800 then proceeds to block 814, which includes adjusting a frequency of the first and second clock signals based on the voltage of the circuit node. For example, in some embodiments, VCO 108 may be configured to adjust the frequency of recovered clock signals 112 and 114 based on the voltage of circuit node 136.

Example Computer-Readable Medium

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 9:
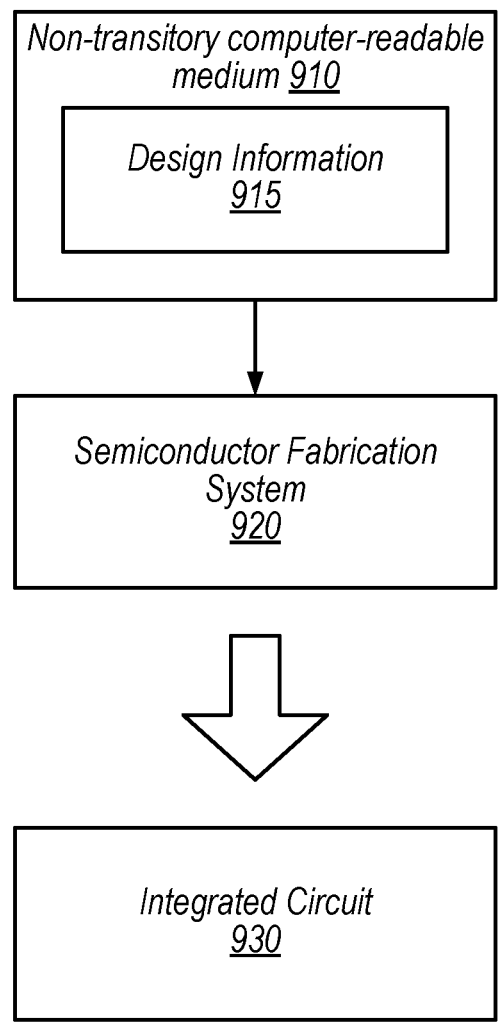
FIG. 9 is a block diagram illustrating an example computer-readable medium, according to some embodiments.

FIG. 9 is a block diagram illustrating an example non-transitory computer-readable storage medium that stores circuit design information, according to some embodiments. In the illustrated embodiment semiconductor fabrication system 920 is configured to process the design information 915 stored on non-transitory computer-readable medium 910 and fabricate integrated circuit 930 based on the design information 915.

Non-transitory computer-readable medium 910, may comprise any of various appropriate types of memory devices or storage devices. Medium 910 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Medium 910 may include other types of non-transitory memory as well or combinations thereof. Medium 910 may include two or more memory mediums which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system 920. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," "third," etc. are used as labels for nouns that they precede, and do not imply any type of ordering (e.g., spatial, temporal, logical, etc.), unless stated otherwise. For example, in an embodiment in which charge pump 130 supplies a current 134 with multiple components to circuit node 136, the terms "second current" and "third current" may be used to refer to any of the components of current 134, and do not imply an order in which the components were supplied to circuit node 136 unless stated otherwise.

When used in the claims, the term "or" is used as an inclusive or and not as an exclusive or. For example, the phrase "at least one of x, y, or z" means any one of x, y, and z, as well as any combination thereof (e.g., x and y, but not z).

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

What is claimed is:

1. An apparatus, comprising:
   a slicing circuit configured to sample an input signal to generate:
      a first sampled data signal based on a first clock signal, and
      a second sampled data signal based on a second clock signal;
   a phase detector circuit configured to:
      perform a comparison of a phase of the first sampled data signal to a phase of the second sampled data signal; and
      generate, based on a result of the comparison, a first control signal and a second control signal that are indicative of a difference in phase between the first sampled data signal and the second sampled data signal;
   a control circuit configured to generate a third control signal and a fourth control signal using the first and second control signals;
   a first charge pump circuit configured to supply a first current to a circuit node using the first and second control signals generated by the phase detector circuit;
   a second charge pump circuit configured to supply a second current to the circuit node based on the third and fourth control signals, wherein the second current is of opposite polarity to the first current; and
   a voltage-controlled oscillator circuit configured to adjust a frequency of the first and second clock signals based on a voltage of the circuit node.

2. The apparatus of claim 1, wherein the first charge pump circuit is configured to supply the first current at a first time, and wherein the control circuit and the second charge pump circuit are configured to supply the second current at a second time later than the first time.

3. The apparatus of claim 1, wherein, to generate the third and fourth control signals, the control circuit is further configured to:
   latch a state of the first control signal using the first clock signal to generate the fourth control signal; and
   latch a state of the second control signal using the first clock signal to generate the third control signal.

4. The apparatus of claim 1, wherein, to generate the third and fourth control signals, the control circuit is further configured to:
   latch a state of the first control signal using the first clock signal to generate a latched first control signal;
   latch a state of the second control signal using the first clock signal to generate a latched second control signal;
   logically combine the second control signal and the latched first control signal to generate the fourth control signal; and
   logically combine the first control signal and the latched second control signal to generate the third control signal.

5. The apparatus of claim 1, wherein the second charge pump circuit is further configured to supply a third current to the circuit node using the third control signal, wherein the third current is of a same polarity as the first current; and wherein, to supply the second current to the circuit node, the second charge pump circuit is further configured to supply the second current to the circuit node using the fourth control signal.

6. The apparatus of claim 1, wherein a magnitude of the second current is less than a magnitude of the first current, wherein the second current acts to settle the voltage of the circuit node.

7. The apparatus of claim 1, further comprising a loop filter circuit configured to attenuate at least one frequency component include in the voltage of the circuit node;
   wherein the input signal includes a plurality of data symbols; and
   wherein a magnitude of the second current is based on a magnitude of the first current scaled by a factor that is based on a duration of a data symbol of the plurality of data symbols and a time constant of the loop filter circuit.

8. The apparatus of claim 1, wherein the second charge pump circuit is further configured to adjust a magnitude of the second current.

9. The apparatus of claim 8, wherein the second charge pump circuit is configured to adjust the magnitude of the second current based on a settling time of the voltage at the circuit node.

10. A method, comprising:
    generating, by a voltage-controlled oscillator, a first clock signal and a second clock signal based on a voltage of a circuit node;
    sampling, by a slicing circuit, an input signal using the first clock signal and the second clock signal to generate a first sampled data signal and a second sampled data signal, respectively;
    comparing, by a phase detector circuit, a phase of the first sampled data signal and a phase of the second sampled data signal;
    generating, by the phase detector circuit based on a result of the comparing, first and second control signals that are indicative of a difference in phase between the first sampled data signal and the second sampled data signal;
    generating, by a control circuit, third and fourth control signals using the first and second control signals;
    modifying, by a first charge pump, a voltage of a circuit node, including by:
       generating a first current using the first and second control signals generated by the phase detector circuit;
    modifying, by a second charge pump, the voltage of the circuit node, including by:
       generating a second current based on the third and fourth control signals, wherein the second current is of opposite polarity to the first current; and
    adjusting, by the voltage-controlled oscillator, a frequency of the first clock signal and the second clock signal based on the voltage of the circuit node.

11. The method of claim 10, wherein modifying, by the first charge pump, the voltage of the circuit node includes sourcing the first current to the circuit node based on the first control signal; and wherein modifying, by the second charge pump, the voltage of the circuit node includes sinking the second current from the circuit node based on the fourth control signal.

12. The method of claim 1, wherein the second current is delayed relative to the first current, wherein the second current acts to settle the voltage of the circuit node.

13. The method of claim 12, wherein modifying, by the second charge pump, the voltage of the circuit node further includes:
    sourcing a third current to the circuit node based on the third control signal, wherein the third current is not delayed relative to the first current.

14. The method of claim 13, wherein a magnitude of the second current is equal to a magnitude of the third current, wherein a polarity of the second current is opposite of a polarity of the third current.

15. The method of claim 10, further comprising:
    attenuating, by a loop filter circuit, at least one frequency component include in the voltage of the circuit node;
    wherein the input signal includes a plurality of data symbols; and
    wherein a magnitude of the second current is based on a magnitude of the first current scaled by a particular factor, wherein the particular factor is based on a duration of a data symbol of the plurality of data symbols and a time constant of the loop filter circuit.

16. A non-transitory computer readable storage medium having stored thereon design information that specifies a design of at least a portion of a hardware integrated circuit in a format recognized by a semiconductor fabrication system that is configured to use the design information to produce the hardware integrated circuit according to the design, wherein the design information specifies that the hardware integrated circuit comprises:
    a slicing circuit configured to sample an input signal to generate:
       a first sampled data signal based on a first clock signal, and
       a second sampled data signal based on a second clock signal;
    a phase detector circuit configured to:
       perform a comparison of a phase of the first sampled data signal and a phase of the second sampled data signal; and generate a first control signal and a second control signal based on a result of the comparison;

a control circuit configured to generate a third and a fourth control signal using latched versions of the first and second control signals;

a first charge pump circuit configured to supply a first current to a circuit node based on the first and second control signals;

a second charge pump circuit configured to supply a second current to the circuit node based on the third and fourth control signals, wherein the second current is of opposite polarity to the first current; and a voltage-controlled oscillator circuit configured to adjust a frequency of the first and second clock signals based on a voltage of the circuit node.

17. The non-transitory computer readable storage medium of claim 16, wherein the first charge pump circuit is configured to supply the first current at a first time, and wherein the second charge pump circuit is configured to supply the second current at a second time later than the first time.

18. The non-transitory computer readable storage medium of claim 16, wherein, to generate the third and fourth control signals, the control circuit is further configured to:

latch a state of the first control signal using the first clock signal to generate the latched version of the first control signal;

latch a state of the second control signal using the first clock signal to generate the latched version of the second control signal;

logically combine the second control signal and the latched version of the first control signal to generate the fourth control signal; and logically combine the first control signal and the latched version of the second control signal to generate the third control signal.

19. The non-transitory computer readable storage medium of claim 16, wherein the design information includes mask design data indicative of a circuit design for the control circuit.

20. The non-transitory computer readable storage medium of claim 16, wherein the fourth control signal is the latched version of the first control signal, and wherein the third control signal is the latched version of the second control signal.

* * * * *